(12) United States Patent
Menard

(10) Patent No.: US 10,211,326 B2
(45) Date of Patent: Feb. 19, 2019

(54) VERTICAL POWER COMPONENT

(71) Applicant: STMicroelectronics (Tours) SAS, Tours (FR)

(72) Inventor: Samuel Menard, Tours (FR)

(73) Assignee: STMicroelectronics (Tours) SAS, Tours (FR)

( * ) Notice: Subject to any disclaimer, the term of this patent is extended or adjusted under 35 U.S.C. 154(b) by 0 days.

(21) Appl. No.: 15/362,919

(22) Filed: Nov. 29, 2016

(65) Prior Publication Data

US 2017/0288044 A1    Oct. 5, 2017

(30) Foreign Application Priority Data

Mar. 31, 2016  (FR) ...................................... 16 52823
Mar. 31, 2016  (FR) ...................................... 16 52824

(51) Int. Cl.
*H01L 29/747*    (2006.01)
*H01L 29/66*    (2006.01)
*H01L 29/40*    (2006.01)

(52) U.S. Cl.
CPC .......... *H01L 29/747* (2013.01); *H01L 29/408* (2013.01); *H01L 29/66386* (2013.01)

(58) Field of Classification Search
CPC ............. H01L 29/747; H01L 29/66386; H01L 29/408
USPC .................. 257/129, 170; 438/133, 134, 140
See application file for complete search history.

(56) References Cited

U.S. PATENT DOCUMENTS

| | | | | | |
|---|---|---|---|---|---|
| 3,226,611 | A | * | 12/1965 | Haenichen | H01L 21/00 148/33.3 |
| 3,649,886 | A | * | 3/1972 | Kooi | H01L 27/0883 257/638 |
| 3,767,483 | A | * | 10/1973 | Tokuyama | H01L 21/02129 148/DIG. 118 |
| 4,009,483 | A | * | 2/1977 | Clark | H01L 21/32055 257/489 |

(Continued)

FOREIGN PATENT DOCUMENTS

| | | |
|---|---|---|
| DE | 4410354 A1 | 10/1995 |
| EP | 1076363 A2 | 2/2001 |

(Continued)

OTHER PUBLICATIONS

INPI Search Report and Written Opinion for FR 1652823 dated Nov. 28, 2016 (11 pages).

(Continued)

*Primary Examiner* — Victoria K Hall
(74) *Attorney, Agent, or Firm* — Crowe & Dunlevy

(57) ABSTRACT

A vertical power component includes a doped silicon substrate of a first conductivity type. A local well of a second conductivity type extends from an upper surface of the substrate. A passivation structure coats a peripheral region of the upper surface side of the substrate surrounding the well. This passivation structure includes, on top of and in contact with the peripheral substrate region, a first region made of a first passivation material and a second region made of a second passivation material. The second region generates, in a surface region of the substrate in contact with said second region, a local increase of the concentration of majority carriers in the substrate.

11 Claims, 2 Drawing Sheets

(56) References Cited

U.S. PATENT DOCUMENTS

| | | | | |
|---|---|---|---|---|
| 4,091,527 | A | * | 5/1978 | Goodman ......... H01L 21/02238 257/351 |
| 4,389,967 | A | * | 6/1983 | Shimoda ............... C30B 31/103 104/138.1 |
| 4,916,082 | A | * | 4/1990 | Lesk ................. H01L 21/28273 257/E21.209 |
| 5,212,119 | A | * | 5/1993 | Hah .................... H01L 21/3105 148/DIG. 118 |
| 10,068,999 | B2 | * | 9/2018 | Menard ............... H01L 29/7424 |
| 2010/0219462 | A1 | * | 9/2010 | Darwish ............. H01L 29/0634 257/329 |
| 2013/0028003 | A1 | * | 1/2013 | Wang ................ G11C 13/0007 365/148 |
| 2013/0307127 | A1 | | 11/2013 | Schulze et al. |
| 2014/0008652 | A1 | * | 1/2014 | Hsu ....................... H01L 23/481 257/52 |
| 2016/0049465 | A1 | | 2/2016 | Konstantinov |

FOREIGN PATENT DOCUMENTS

| | | |
|---|---|---|
| EP | 1544919 A1 | 6/2005 |
| FR | 2325196 A1 | 4/1977 |

OTHER PUBLICATIONS

INPI Search Report and Written Opinion for FR 1652824 dated Nov. 29, 2016 (9 pages).

Burte et al: "The influence of annealing on the capacitance-voltage characteristics of metal/SIPOS/silicon capacitors", Solid State Electronics, Elsevier Science Publishers, Barking, GB, vol. 31, No. 12, Dec. 1, 1988 (Dec. 1, 1988), pp. 1663-1666.

Burte, et al. "The correlation between the breakdown voltage of power devices passivated by semi-insulating polycrystalline silicon and the effective density of interface charges", IEEE Transactions on Electron Devices 38(6):1505-1509, Jul. 1991.

* cited by examiner

VERTICAL POWER COMPONENT

PRIORITY CLAIM

This application claims the priority benefit of French Application for Patent Nos. 1652823 and 1652824, filed Mar. 31, 2016, the disclosures of which are hereby incorporated by reference.

TECHNICAL FIELD

The present disclosure relates to a vertical semiconductor power component capable of withstanding a high voltage in the off state, and more specifically aims at the structure of the periphery of such a component.

BACKGROUND

Various ways to form the periphery of a vertical power component, in order to protect the component edges, and in particular to provide a high breakdown voltage of the component and to limit leakage currents have been provided.

Known peripheral structures of vertical power component however have disadvantages.

There is accordingly a need in the art for a peripheral structure of a vertical power component overcoming all or part of the disadvantages of known structures.

SUMMARY

Thus, an embodiment provides a vertical power component comprising: a doped silicon substrate of a first conductivity type; a local well of the second conductivity type extending from an upper surface of the substrate; and on the upper surface side of the substrate, a passivation structure coating a peripheral region of the substrate surrounding the well, said passivation structure comprising, on top of and in contact with said peripheral substrate region, a first region made of a first passivation material and a second region made of a second passivation material, the second region being capable of generating, in a surface region of the substrate in contact with said second region, a local increase of the concentration of majority carriers in the substrate.

According to an embodiment, the second region is made of phosphosilicate glass.

According to an embodiment, the second region is made of a material capable of generating fixed positive charges at the interface with silicon.

According to an embodiment, the second region is made of semi-insulating polysilicon.

According to an embodiment, the second region is made of silicon nitride.

According to an embodiment, the first region is made of silicon oxide.

According to an embodiment, the first region is made of lead glass.

According to an embodiment, one of the first and second regions of the passivation structure is a layer coating said peripheral region of the substrate, interrupted by a ring-shaped opening arranged opposite a central portion of said peripheral region of the substrate, the other region of the passivation structure being a ring-shaped strip arranged in said opening.

Another embodiment provides a method of manufacturing a vertical power component inside and on top of a doped silicon substrate of a first conductivity type, comprising the steps of: forming a local well of the second conductivity type extending from an upper surface of the substrate; and forming, on the upper surface side of the substrate, a passivation structure coating a peripheral region of the substrate surrounding the well, said passivation structure comprising, on top of and in contact with said peripheral substrate region, a first region made of a first passivation material and a second region made of a second passivation material, the second region being capable of generating, in a surface region of the substrate in contact with said second region, a local increase of the concentration of majority carriers in the substrate.

According to an embodiment, the second region is made of phosphosilicate glass, the forming of the second region comprising a step of depositing phosphosilicate glass at the surface of said peripheral region of the substrate, followed by a step of annealing at a temperature higher than 500° C.

According to an embodiment, the second region is made of semi-insulating polysilicon, the forming of the second region comprising a step of depositing semi-insulating polysilicon at the surface of said peripheral region of the substrate, followed by a step of annealing at a temperature in the range from 200 to 400° C. or at a temperature higher than 700° C.

According to an embodiment, the second region is made of silicon nitride, the forming of the second region comprising a step of depositing the second region comprising a step of depositing silicon nitride at the surface of said peripheral region of the substrate, by chemical vapor deposition under a gas flow comprising a mixture of silane and of ammonia, with a ratio R of the ammonia content to the silane content in the mixture smaller than 100 or greater than 900.

BRIEF DESCRIPTION OF THE DRAWINGS

The foregoing and other features and advantages will be discussed in detail in the following non-limiting description of specific embodiments in connection with the accompanying drawings, wherein.

DETAILED DESCRIPTION

Figure 1:
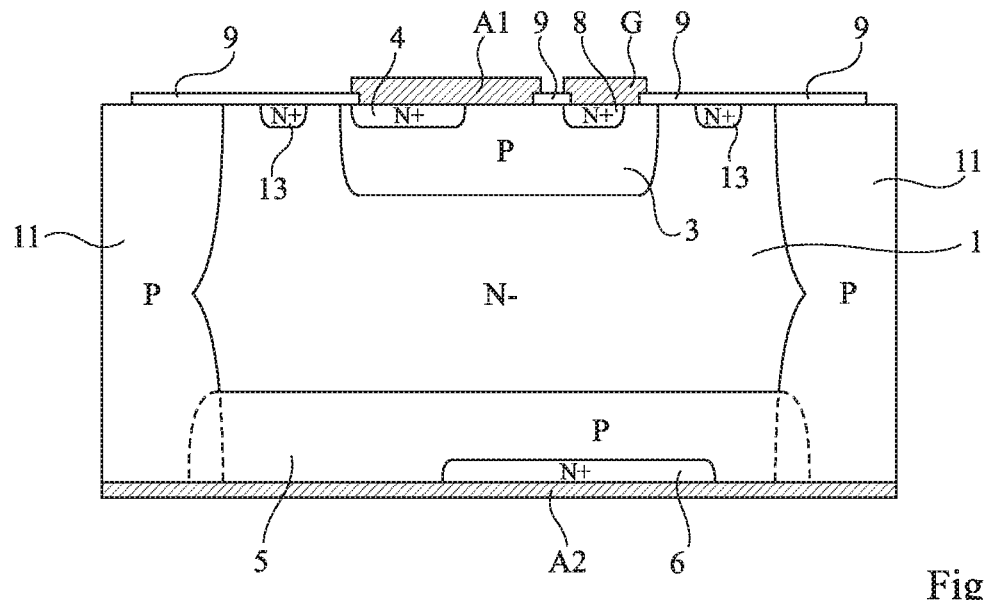
FIG. 1 is a cross-section view of an example of a vertical power component.

The same elements have been designated with the same reference numerals in the different drawings and, further, the various drawings are not to scale. For clarity, only those elements which are useful to the understanding of the described embodiments have been shown and are detailed. In particular, the various uses which may be made of a vertical power component have not been detailed, the described embodiments being compatible with usual applications of vertical power components, for example, the control of motors, or the control of household appliances such as refrigerator compressors, vacuum cleaners, air conditioning units, washing machines, etc. In the following description, when reference is made to terms qualifying absolute positions, such as terms "front", "rear", "top", "bottom", "left", "right", etc., or relative positions, such as terms "above", "under", "upper", "lower", etc., or to terms qualifying directions, such as terms "horizontal", "vertical", etc., it is referred to the orientation of the drawings, it being understood that, in practice, the described components may be oriented differently. Unless otherwise specified, expressions "approximately", "substantially", and "in the order of" mean to within 10%, preferably to within 5%.

In the present description, vertical power component means a component comprising first and second conduction electrodes arranged on opposite surfaces of a silicon substrate, the component being capable, in the off state, of withstanding a high voltage, for example, higher than 100 V and typically higher than 500 V, between its first and second conduction electrodes. Vertical power switches capable of withstanding high voltages between their conduction terminals whatever the biasing of the applied voltage, also called bidirectional voltage switches, are here considered. Switches bidirectional for voltage may be bidirectional for current, for example, triacs, or one-way for current, for example, thyristors or some IGBTs.

FIG. 1 is a cross-section view of a vertical power component, illustrating a way of forming the periphery of such a component in so-called "planar" technology to protect the component edges.

The component shown in the present example is a triac. It comprises an N-type doped silicon substrate 1 (N⁻) and extending in substrate 1 from its upper surface, a local P-type doped well 3 (P). Well 3 extends, in top view, over a portion only of the surface of substrate 1, for example, over more than half the surface of substrate 1. Well 3 is arranged in a non-peripheral portion of substrate 1, that is, it does not extend all the way to the periphery of substrate 1. The component of FIG. 1 further comprises, extending in substrate 1 from the lower surface thereof, a P-type doped layer 5 (P). Layer 5 extends, in bottom view, over substantially the entire surface of substrate 1. More particularly, layer 5 extends all the way to a P-type doped peripheral insulating wall 11 (P), described in further detail hereafter.

Upper layer 3 contains, on its upper surface side, an N-type doped region 4 (N⁺), having a higher doping level than substrate 1. Lower layer 5 contains, on its lower surface side, an N-type doped region 6 (N⁺), having a higher doping level than substrate 1, for example having substantially the same doping level as region 4, located in an area substantially complementary (in top view) to that occupied by region 4. Upper well 3 further contains, on its upper surface side, an N-type doped region 8 (N⁺), non-adjacent to region 4, having a higher doping level than the substrate, for example, substantially of same doping level as region 4.

On the lower surface side of the component, a conduction electrode A2 coats and is in contact with substantially the entire surface of layer 5. On the upper surface side of the component, a conduction electrode A1 coats and is in contact with region 4 and a portion of well 3. Electrode A1 is, however, not in contact with the peripheral region of substrate 1 surrounding well 4. Further, on the upper surface side of the component, a gate electrode G separate from electrode A1 coats and is in contact with region 8 and a portion of well 3.

On the upper surface side of the component, an insulating passivation layer 9 made of silicon oxide coats the portions of the upper surface of the substrate which are not covered with electrodes, and in particular the PN junction between well 3 and substrate 1 and the peripheral region of substrate 1 surrounding well 3. Silicon oxide layer 9 may be topped with other passivation layers, not shown, which may be inorganic (for example, silicon nitride) or organic (for example, based on polyimides).

Whatever the polarity of the voltage applied between electrodes A2 and A1, if a gate control signal is provided, the component turns on. The conduction is performed from electrode A2 to electrode A1 by a vertical thyristor comprising regions 5, 1, 3, and 4, or from electrode A1 to electrode A2 by a vertical thyristor comprising regions 3, 1, 5, and 6. The thickness and the doping level of substrate 1 are calculated so that the triac, in the off state, can withstand high voltages, for example, voltages in the range from 600 to 800 volts.

In the shown example, the triac is entirely surrounded with a P-type doped diffused wall 11 (P) formed from the lower and upper surfaces of the substrate and extending across the entire thickness of the substrate. On the lower surface side of the component, layer 5 extends laterally all the way to diffused wall 11, and on the upper surface side, well 3 stops before diffused wall 11. Wall 11 particularly has the function of insulating the lateral surfaces of substrate 1 and of thus avoiding possible short-circuits of the component by solder wicking when lower electrode A2 of the component is welded to a contact area of an external device.

To avoid breakdowns from occurring at the component edges, a certain distance should be provided between the limit of P-type well 3 and diffused wall 11.

Given the relative instability of the interface between the silicon oxide of layer 9 and the silicon of substrate 1 (interface states, hot electrons, etc.), the component further comprises an N-type doped channel stop ring 13 (N+), having a higher doping level than substrate 1, for example having substantially the same doping level and the same depth as region 4, arranged in peripheral substrate region 1 located between well 3 and wall 11 (non-adjacent to well 3 and to wall 11 in the shown example). Channel stop ring 13 extends in substrate 1 from the upper surface thereof and surrounds, in top view, well 3. Channel stop ring 13 enables to prevent the forming of a parasitic P-type channel in the substrate surface area located under the silicon oxide layer 9. In the absence of channel stop ring 13, such a parasitic channel may in particular appear in conditions of high instability of the silicon oxide/oxide interface states, typically when the component is kept in the off state at a relatively high temperature. The provision of channel stop ring 13 enables an improvement in the breakdown voltage of the component and a reduction in leakage currents. As a variation, not shown, to make uniform the potential all over ring 13, the ring 13 may be contacted along its entire length by a floating metallization (not connected) arranged in an opening previously formed in layer 9 and emerging on the upper surface of ring 13.

As an example, substrate 1 has a doping level in the range from $10^{14}$ to $2*10^{14}$ atoms/cm³, P-type doped regions 3, 5, and 11 have a doping level in the range from $10^{18}$ to $10^{19}$ atoms/cm³, and N-type doped regions 4, 6, 8, and 13 have a doping level in the range from $10^{19}$ to $2*10^{20}$ atoms/cm³.

In practice, it can be observed that the presence of channel stop ring 13 results in the degradation of the switching performance of the component. Such a degradation especially results from the fact that the channel stop ring forms, around the active portion of the component, a peripheral ring-shaped path where the electron mobility is high, which results in unwanted electron transfers between the first thyristor, formed by regions 5, 1, 3, and 4 (left-hand portion of the drawing) and the second thyristor, formed by regions 3, 1, 5, and 6 (right-hand portion of the drawing), causing a degradation of the switching performance of the switch.

Figure 2:
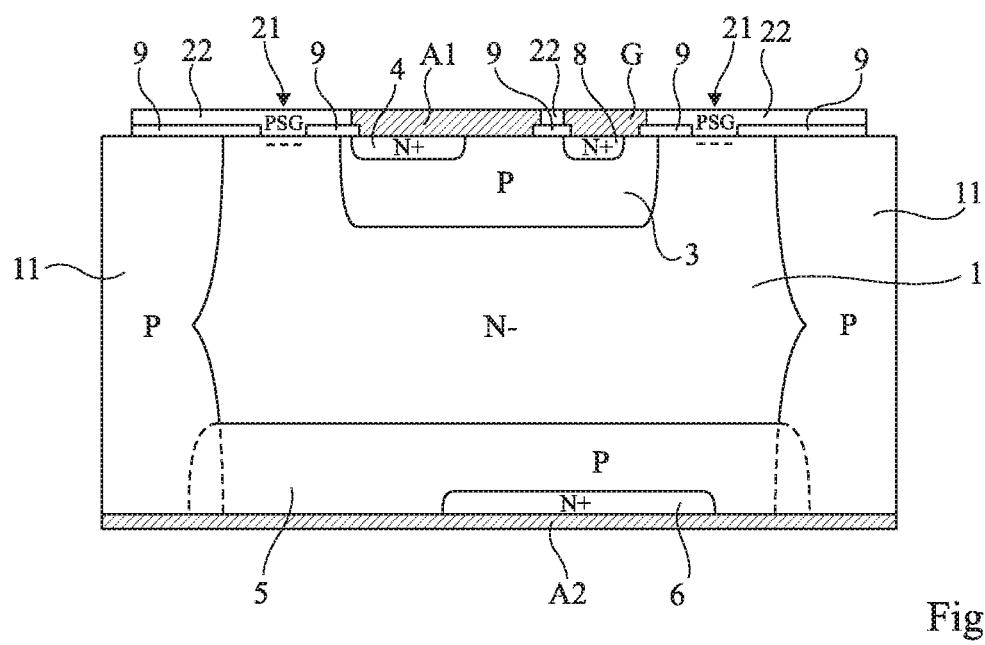
FIG. 2 is a cross-section view of an example of a vertical power component according to a first embodiment.

FIG. 2 is a cross-section view of an example of a vertical power component.

FIG. 2 shows a triac comprising the same elements as the triac of FIG. 1, except for channel stop ring 13. In the embodiment of FIG. 2, silicon oxide passivation layer 9 is discontinuous. More particularly, layer 9 is interrupted by a ring-shaped opening surrounding (in top view) well 3, this opening being arranged opposite a central portion of the peripheral substrate region 1 surrounding well 3, and having a width smaller than that of said peripheral substrate region. The ring-shaped opening formed in passivation layer 9 is filled with a second passivation material, a phosphosilicate glass (PSG) in the example of FIG. 2. Thus, silicon oxide layer 9 coating the peripheral region of substrate 1 is interrupted by a ring-shaped phosphosilicate glass strip 21, arranged on top of and in contact with the upper surface of the peripheral region of substrate 1 surrounding well 3. In the shown example, for reliability reasons, phosphosilicate glass is further deposited over substantially the entire surface of silicon oxide layer 9. In other words, ring-shaped strip 21 is a portion of a larger phosphosilicate glass layer 22 substantially coating the entire surface of layer 9 and being in contact with the upper surface of substrate 1 at the level of the ring-shaped opening formed in layer 9.

The method of manufacturing the passivation structure of FIG. 2 comprises:

forming silicon oxide passivation layer 9, for example, by thermal oxidation of the upper surface of substrate 1;

forming, in layer 9, a through ring-shaped opening surrounding (in top view) well 3;

depositing a phosphosilicate glass to fill the opening previously formed in silicon oxide layer 9; and after the deposition of the phosphosilicate glass in the opening, a stabilization anneal, for example, at a temperature greater than 500° C., for example, at a temperature in the order of 900° C.

During the stabilization anneal, phosphorus atoms originating from the phosphosilicate glass diffuse from ring-shaped strip 21 into a substrate surface region located under ring-shaped strip 21, for example, down to a depth in the range from 10 to 100 nm from the upper surface of the substrate. This amounts to performing a slight N-type over-doping of the substrate surface region located under ring-shaped passivation strip 21. Electrons thus accumulate in the surface region of substrate 1 located under ring-shaped step 21. Such a local accumulation of electrons prevents the forming of a parasitic P-type channel in the peripheral region of substrate 1 surrounding well 3. Due to the small depth of the substrate surface region impacted by the N-type overdoping, and/or due to the relatively low surface density of electrons, for example, in the range from $5*10^{15}$ to $5*10^{16}$ $e^-/cm^2$, for example, in the order of $10^{16}$ $e^-/cm^2$, in this region, the mobility of electrons in this region remains relatively small as compared with the mobility of electrons in channel stop ring 13 of the component of FIG. 1. Thus, the passivation structure of FIG. 2 ensures a good breakdown voltage of the component and limits leakage currents, while avoiding the degradation of the switching performances observed in structures of the type described in relation with FIG. 1. In practice, the depth of the phosphorus doping as well as the dopant concentration is a function of the temperature and of the duration of the stabilization anneal, as well as of the phosphorus content of the phosphosilicate glass, for example, in the range from 2 to 10%.

Figure 3:
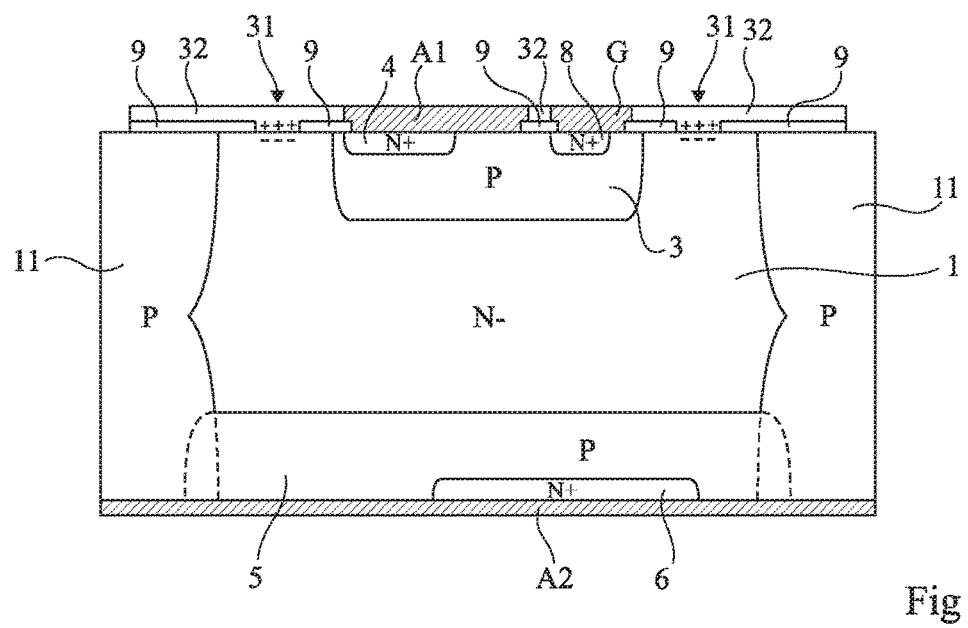
FIG. 3 is a cross-section view of an example of a vertical power component according to a second embodiment.

FIG. 3 is a cross-section view of an example of a vertical power component.

FIG. 3 shows a triac. The triac of FIG. 3 differs from the triac of FIG. 2 essentially in that, in the example of FIG. 3, the phosphosilicate glass ring-shaped passivation strip 21 of the triac of FIG. 2 has been replaced with a ring-shaped passivation ring 31 made of a passivation material capable of generating stable fixed positive charges at the interface with silicon, and accordingly of generating an accumulation of electrons in the surface region of substrate 1 located under ring-shaped strip 31. Here again, this prevents the forming of a parasitic P-type channel in the peripheral region of substrate 1 surrounding well 3, which provides for improved voltage behavior and a decrease in leakage currents. Further, due to the small depth, for example, in the range from 1 to 25 nm, of the substrate surface region where the electrons accumulate, and/or due to the relatively low electron density, for example, in the range from $5*10^{18}$ to $5*10^{19}$ $e^-/cm^3$, for example, in the order of $10^{18}$ $e^-/cm^3$, in this region, the electron mobility remains relatively low as compared with the electron mobility in channel-stop ring 13 of the component of FIG. 1. Thus, the passivation structure of FIG. 3 enables the improvement of the switching performance as compared with a structure of the type described in relation with FIG. 1. In practice, the depth of the electron accumulation area and the electron density depends on the charge concentration at the interface, for example, in the range from $10^{11}$ to $10^{13}$, for example, in the order of $10^{12}$ charges/$cm^2$. In the same way as in the example of FIG. 2, in the shown example, for reasons of reliability, the second passivation material is further deposited over substantially the entire surface of silicon oxide layer 9. In other words, ring-shaped strip 31 is a portion of a larger layer 32 of the second passivation material, substantially coating the entire surface of layer 9 and being in contact with the upper surface of substrate 1 at the level of the ring-shaped opening formed in layer 9.

As an example, the second passivation material forming ring-shaped strip 31 is SIPOS (Semi-Insulating Polycrystalline Silicon), or silicon nitride. Examples of methods enabling to form a SIPOS or silicon nitride layer on a silicon substrate, to generate fixed positive charges at the SIPOS/silicon or nitride/silicon interface, are described in "The correlation between the breakdown voltage of power devices passivated by semi-insulating polycrystalline silicon and the effective density of interface charges" of Edmund P. Burte and Gunter H. Schulze, IEEE Transactions on Electron Devices 38(6):1505-1509, July 1991 (incorporated by reference).

As an example, ring-shaped strip 31 is made of SIPOS and the passivation structure manufacturing method comprises:

forming silicon oxide passivation layer 9, for example, by thermal oxidation of the upper surface of substrate 1;

forming, in layer 9, a through ring-shaped opening surrounding (in top view) well 3;

depositing SIPOS to fill the opening previously formed in silicon oxide layer 9; and after the SIPOS deposition, performing a stabilization anneal at a temperature in the range from 200 to 400° C., for example, in the order of 300° C., or at a temperature greater than 700° C., for example, in the order of 900° C.

As an example, ring-shaped strip 31 is made of silicon nitride and the passivation structure manufacturing method comprises:

forming silicon oxide passivation layer 9, for example, by thermal oxidation of the upper surface of substrate 1;

forming, in layer 9, a through ring-shaped opening surrounding (in top view) well 3; and depositing silicon nitride to fill the opening previously formed in silicon oxide layer 9, by chemical vapor deposition under a gas flow comprising a mixture of silane ($SiH_4$)

and ammonia ($NH_3$), with a ratio R of the ammonia content to the silane content in the mixture smaller than 100 or greater than 900.

Specific embodiments have been described. Various alterations, modifications, and improvements will occur to those skilled in the art. In particular, in the embodiments of FIGS. 2 and 3, silicon oxide layer 9 may be replaced with a layer of another passivation material, for example, glass capable of generating fixed negative charges at the interface with silicon, for example, lead glass.

Further, in FIG. 2, the passivation materials of layer 9 and of ring-shaped strip 21 may be inverted. Similarly, in FIG. 3, the passivation materials of layer 9 and of ring-shaped strip 31 may be inverted.

Further, the described embodiments may be adapted to components formed inside and on top of a P-type doped silicon substrate 1. In this case, all conductivity types may be inverted. The second passivation material, respectively forming ring-shaped strip 21 in the example of FIG. 2 and ring-shaped strip 31 in the example of FIG. 3, will then be selected to generate a hole accumulation in the underlying substrate surface area, to prevent the forming of an N-type channel in the peripheral region of substrate 1 surrounding well 3.

Thus, a common point between the above-described embodiments is that the passivation structure coating the peripheral region of substrate 1 surrounding well 3 comprises an alternation of two regions made of different passivation materials, one of the two materials being capable of generating, in a surface area of substrate 1 in contact with the material, an accumulation or a local overconcentration of carriers of the same type as the majority carriers in substrate 1, that is, electrons in the case of an N-type substrate, and holes in the case of a P-type substrate. Passivation material here means an insulating or semi-insulating material, for example, having an electric conductivity smaller than $10^{-8}$ S·$cm^{-1}$ at 25° C.

Further, the above-described embodiments may be adapted to vertical power components other than triacs, for example, thyristors, transistors, IGBTs, etc.

Further, the described embodiments are not limited to the shown examples where the component comprises a diffused wall extending at the component periphery across the entire substrate thickness.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

The invention claimed is:

1. A vertical power component, comprising:
a doped silicon substrate of a first conductivity type;
a local well of the second conductivity type extending from an upper surface of the doped silicon substrate; and
on the upper surface side of the doped silicon substrate, a passivation structure coating a peripheral region of the doped silicon substrate surrounding the local well, said passivation structure comprising a first region made of a first passivation material on top of and in contact with said peripheral region and a second region made of a second passivation material on top of and in contact with said peripheral region at an interface, the second passivation material providing fixed positive charges at the interface with the doped silicon substrate surrounding the local well, to cause, in a surface region of the doped silicon substrate in contact with said second passivation material, a local increase of a concentration of majority carriers in the doped silicon substrate, wherein the second passivation material is silicon nitride.

2. The component of claim 1, wherein the first passivation material is made of silicon oxide.

3. The component of claim 1, wherein the first passivation material is made of lead glass.

4. The component of claim 1, wherein the first region of the passivation structure is a layer coating said peripheral region of the doped silicon substrate, interrupted by a ring-shaped opening arranged opposite a central portion of said peripheral region of the doped silicon substrate, and the second region of the passivation structure is a ring-shaped strip arranged in said opening.

5. A method of manufacturing a vertical power component inside and on top of a doped silicon substrate of a first conductivity type, comprising the steps of:
forming a local well of a second conductivity type extending from an upper surface of the doped silicon substrate; and
forming, on the upper surface side of the doped silicon substrate, a passivation structure coating a peripheral region of the doped silicon substrate surrounding the local well,
wherein forming said passivation structure comprises:
depositing in a first region a first passivation material on top of and in contact with said peripheral region; and
depositing in a second region a second passivation material on top of and in contact with said peripheral region at an interface, the second passivation material providing fixed positive charges at the interface, to cause, in a surface region of the doped silicon substrate in contact with said second passivation material, a local increase of a concentration of majority carriers in the doped silicon substrate, wherein the second passivation material is silicon nitride.

6. The method of claim 5, wherein depositing the second passivation material comprises depositing silicon nitride by chemical vapor deposition under a gas flow comprising a mixture of a silane and of an ammonia, with a ratio of ammonia content to silane content being smaller than 100 or greater than 900.

7. A vertical power component, comprising:
a doped silicon substrate of a first conductivity type;
a local well of the second conductivity type extending from an upper surface of the doped silicon substrate; and
on the upper surface side of the doped silicon substrate, a passivation structure coating a peripheral region of the doped silicon substrate surrounding the local well, said passivation structure comprising a first region made of a first passivation material on top of and in contact with said peripheral region and a second region made of a second passivation material on top of and in contact with said peripheral region at an interface where no doped guard ring is present in the peripheral region, the second passivation material providing fixed positive charges at the interface with the doped silicon substrate surrounding the local well, to cause, in a surface region of the doped silicon substrate in contact with said second passivation material, a local increase of a concentration of majority carriers in the doped silicon substrate, wherein the second region is made of semi-insulating polysilicon.

8. The component of claim 7, wherein the first passivation material is made of lead glass.

9. The component of claim 7, wherein the first region of the passivation structure is a layer coating said peripheral region of the doped silicon substrate, interrupted by a ring-shaped opening arranged opposite a central portion of said peripheral region of the doped silicon substrate, and the second region of the passivation structure is a ring-shaped strip arranged in said opening.

10. A method of manufacturing a vertical power component inside and on top of a doped silicon substrate of a first conductivity type, comprising the steps of:
    forming a local well of a second conductivity type extending from an upper surface of the doped silicon substrate; and
    forming, on the upper surface side of the doped silicon substrate, a passivation structure coating a peripheral region of the doped silicon substrate surrounding the local well,
    wherein forming said passivation structure comprises:
    depositing a first region made of a first passivation material on top of and in contact with said peripheral region; and
    depositing a second region made of a second passivation material on top of and in contact with said peripheral region at an interface where no doped guard ring is present in the peripheral region, the second region providing fixed positive charges at the interface, to cause, in a surface region of the doped silicon substrate in contact with said second passivation material, a local increase of a concentration of majority carriers in the doped silicon substrate, wherein the second passivation material is semi-insulating polysilicon.

11. The method of claim 10, wherein the forming of the second region comprising a step of depositing semi-insulating polysilicon at the surface of said peripheral region of the doped silicon substrate, followed by a step of annealing at a temperature in the range from 200 to 400° C., or at a temperature higher than 700° C.

* * * * *